United States Patent
Marelli et al.

(10) Patent No.: US 12,379,670 B2
(45) Date of Patent: Aug. 5, 2025

(54) SUBSTRATE, PATTERNING DEVICE AND METROLOGY APPARATUSES

(71) Applicant: ASML Netherlands B.V., Veldhoven (NL)

(72) Inventors: Mattia Marelli, Eindhoven (NL); Mohammadreza Hajiahmadi, Den Bosch (NL)

(73) Assignee: ASML Netherlands B.V., Veldhoven (NL)

( * ) Notice: Subject to any disclaimer, the term of this patent is extended or adjusted under 35 U.S.C. 154(b) by 180 days.

(21) Appl. No.: 18/000,148

(22) PCT Filed: May 10, 2021

(86) PCT No.: PCT/EP2021/062263
§ 371 (c)(1),
(2) Date: Nov. 29, 2022

(87) PCT Pub. No.: WO2021/239448
PCT Pub. Date: Dec. 2, 2021

(65) Prior Publication Data
US 2023/0205097 A1    Jun. 29, 2023

(30) Foreign Application Priority Data
May 29, 2020 (EP) .................................. 20177328

(51) Int. Cl.
*G03F 7/00* (2006.01)
*G03F 9/00* (2006.01)

(52) U.S. Cl.
CPC ........ *G03F 7/70641* (2013.01); *G03F 9/7026* (2013.01); *G03F 9/7076* (2013.01)

(58) Field of Classification Search
CPC .. G03F 7/70641; G03F 9/7026; G03F 9/7076; G03F 7/70616; G03F 7/706837
See application file for complete search history.

(56) References Cited

U.S. PATENT DOCUMENTS 6,961,116 B2   11/2005   Den Boef et al.
7,382,447 B2 *   6/2008   Mieher ............... G03F 7/70625
                                                       430/30

(Continued)

FOREIGN PATENT DOCUMENTS

EP   2 131 243 A2   12/2009
EP   2 131 243 A3   4/2012

OTHER PUBLICATIONS

International Search Report and Written Opinion of the International Searching Authority directed to related International Patent Application No. PCT/EP2021/062263, mailed Aug. 18, 2021; 11 pages.

(Continued)

*Primary Examiner* — Hung V Nguyen
(74) *Attorney, Agent, or Firm* — Sterne, Kessler, Goldstein & Fox P.L.L.C.

(57) ABSTRACT

Disclosed is a method for determining a focus parameter value used to expose at least one structure on a substrate. The method comprises obtaining measurement data relating to a measurement of said at least one structure, wherein the at least one structure comprises a single periodic structure per measurement location and decomposing said measurement data into component data comprising one or more components of said measurement data. At least one of said components is processed to extract processed component data having a reduced dependence on non-focus related effects and a value for the focus parameter is determined from said processed component data. Associated apparatuses and patterning devices are also disclosed.

14 Claims, 6 Drawing Sheets

(56) References Cited

U.S. PATENT DOCUMENTS

| | | | |
|---|---|---|---|
| 8,436,998 B2* | 5/2013 | Hofmans | G03F 7/70641 |
| | | | 356/399 |
| 9,188,974 B1* | 11/2015 | Mack | G03F 7/70525 |
| 12,007,697 B2* | 6/2024 | Verstraeten | G03F 7/70683 |
| 2008/0018874 A1 | 1/2008 | Dusa et al. | |
| 2009/0135389 A1 | 5/2009 | Hofmans et al. | |
| 2009/0195768 A1 | 8/2009 | Bijnen et al. | |
| 2015/0261097 A1 | 9/2015 | Mathijssen et al. | |
| 2019/0129376 A1 | 5/2019 | Veldman | |

OTHER PUBLICATIONS

Dirksen et al., "Latent image metrology for production wafer steppers," Proc. of SPIE, vol. 2440, Optical/Laser Microlithography VIII, May 26, 1995; pp. 701-711.

* cited by examiner

SUBSTRATE, PATTERNING DEVICE AND METROLOGY APPARATUSES

CROSS-REFERENCE TO RELATED APPLICATIONS

This application claims priority of EP application 20177328.0 which was filed on May 29, 2020 and which is incorporated herein in its entirety by reference.

FIELD OF THE INVENTION

The present invention relates to methods and apparatus usable, for example, in the manufacture of devices by lithographic techniques, and to methods of manufacturing devices using lithographic techniques. The invention relates to metrology devices, and more specifically performing focus measurements using metrology devices usually used for measuring position, such as alignment sensors, and lithography apparatuses having such an alignment sensor.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor or alignment sensor (both terms are used synonymously), typically an optical position sensor.

The lithographic apparatus includes one or more alignment sensors by which positions of marks on a substrate can be measured accurately. Different types of marks and different types of alignment sensors are known from different manufacturers and different products of the same manufacturer. A type of sensor widely used in current lithographic apparatus is based on a self-referencing interferometer as described in U.S. Pat. No. 6,961,116 (den Boef et al). Various enhancements and modifications of the position sensor have been developed, for example as disclosed in US2015261097A1. The contents of all of these publications are incorporated herein by reference.

It is known to use such an alignment sensor to measure the focus setting used to expose a special type of focus sensitive alignment mark or focus mark. Many of these marks may be exposed and read in a focus testing procedure used in tool qualification, setup and recovery operations for example. Such procedures take a few to several hours, during which time the tool is offline. It would be beneficial to reduce the time of such procedures.

SUMMARY OF THE INVENTION

The invention in a first aspect provides a method for determining a focus parameter value used to expose at least one structure on a substrate; comprising: obtaining measurement data relating to a measurement of said at least one structure, wherein the at least one structure comprises a single periodic structure per measurement location; decomposing said measurement data into component data comprising one or more components of said measurement data; processing at least one of said components to extract processed component data having a reduced dependence on non-focus related effects; and determining said focus parameter value from said processed component data.

The invention in a second aspect provides a method for determining a focus parameter value used to expose at least one structure on a substrate; comprising: obtaining measurement data relating to a measurement of said at least one structure, wherein the at least one structure comprises a single periodic structure per measurement location; obtaining a trained model, having been trained to infer focus from said measurement data; and determining said focus parameter value from said trained model and said measurement data.

The invention in a third aspect provides a patterning device comprising a plurality of periodic features for forming periodic structures on a substrate, each of said periodic features comprising alternating first segments and second segments, and wherein a proper subset of said first segments comprises focus sensitive segments.

The invention in a fourth aspect provides a processing device comprising a processor; and program storage comprising a computer program comprising program instructions operable to perform the method of the first or second aspect.

Also disclosed is a lithographic apparatus comprising an alignment sensor; a patterning device support for supporting a patterning device; a substrate support for supporting a substrate; and the processing device of the fourth aspect.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which.

DETAILED DESCRIPTION OF EMBODIMENTS

Before describing embodiments of the invention in detail, it is instructive to present an example environment in which embodiments of the present invention may be implemented.

Figure 1:
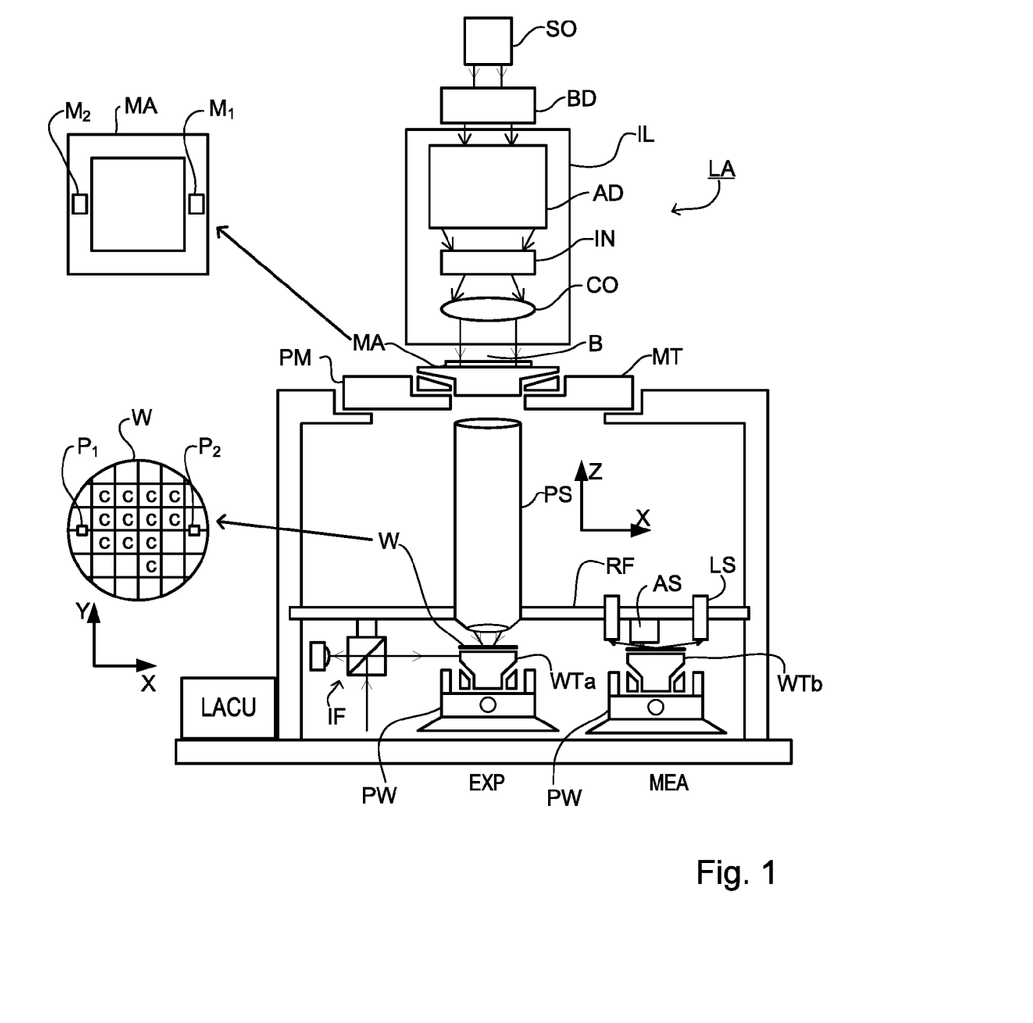
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the marks be as small as possible and not require any different imaging or process conditions than adjacent features. The alignment system, which detects the alignment marks is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment marks on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
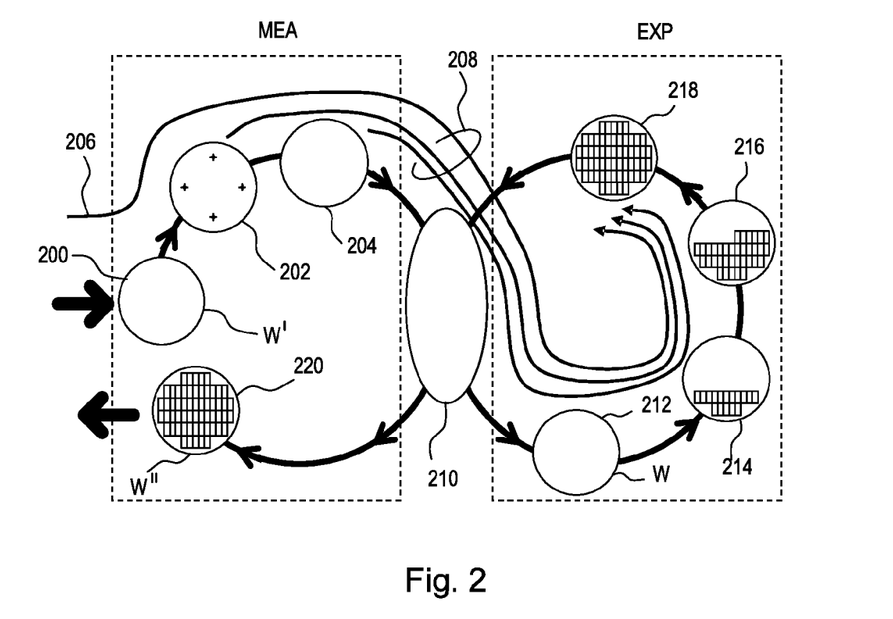
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W''' is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 3:
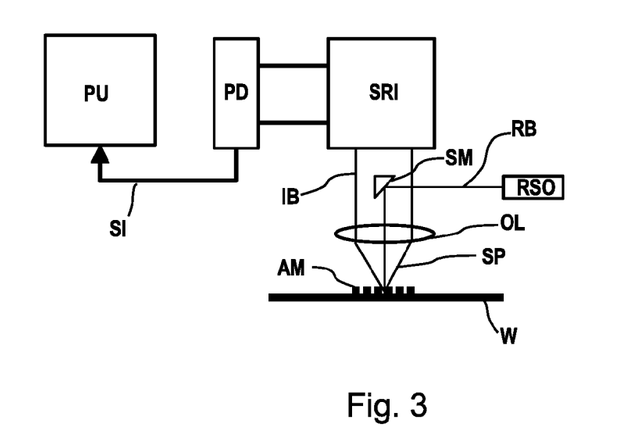
FIG. 3 is a schematic illustration of a first alignment sensor adaptable according to an embodiment.

FIG. 3 is a schematic block diagram of an embodiment of a known alignment sensor AS. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels are repeated at different wavelengths for increased accuracy and/or for robust detection of the mark irrespective of the materials from which the mark is made, and materials on and/or below which the mark is provided.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

A known method of measuring focus of a lithographic projection apparatus using, for example, an alignment sensor is described in published patent application US 2009/0135389 A1, which is incorporated herein by reference. Firstly a wafer is exposed with full wafer coverage (verification) fields at a predetermined optimal focus offset FO. The purpose of the focus offset FO is to be in the most focus sensitive part of a so-called focus curve, as will be explained in more detail below. The reticle used to expose the plurality of verification fields on a test substrate may comprise a plurality of focus marks (e.g., in the region of 250 marks) which, when exposed, produces corresponding marks on a substrate which can be read using an alignment sensor, so as to infer the focus setting during that exposure.

To do this, the marks (on the reticle) may comprise chopped bars with a range of line widths and pitch sizes. Due to the particular dimensions of the structure, the line width of the chops will be focus sensitive according to the well known Bossung principle. As a result of this, when such a mark is exposed out of focus, the exposed mark on the wafer will have an alignment offset. This offset can be used to determine the focus error (or defocus) using an alignment sensor or other suitable metrology device.

Figure 4:
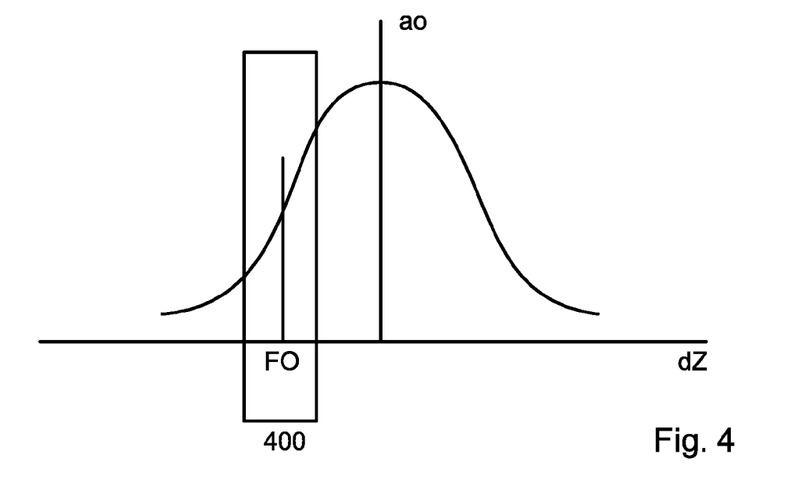
FIG. 4 shows an example of a focus curve comprising a plot of alignment offset ao of measured marks against defocus dZ.

To exploit this, the verification fields may be exposed using a predetermined focus offset. The particular focus offset is determined by looking at a focus curve already exposed on the lithographic apparatus. FIG. 4 shows such a curve, which is a plot of alignment offset ao of measured marks against defocus dZ. On the plot of FIG. 4, a useful focus offset FO is shown. Around the focus offset FO, a focus range (indicated by rectangle with reference 400) is determined for which there is a unique relationship between the alignment offset and defocus dZ. The focus offset FO may be such that all the exposed focus marks will be within the usable focus range 400 throughout the exposure. This means for example that the predetermined focus offset FO cannot be too close to the dZ=0 axis, since the alignment offset as function of dZ is zero which is not usable for the method. In an embodiment, the focus offset FO is selected to be in the middle of a working range 400 where the focus curve is substantially linear, since this is the region of maximum focus-versus-alignment sensitivity.

After the exposure of the verification fields, the test substrate is developed and an alignment offset for each of the verification marks is measured using, for example, a standard alignment sensor present in the system. Next, the measured alignment offsets for each of the verification marks are translated into defocus data using what is called a transposed focus curve. This transposed focus curve may be determined by transposing a section of the focus curve of the lithographic apparatus corresponding to a working range indicated by rectangle 400. The transposed focus curve is in fact the focus sensitivity of the apparatus.

Figure 5:
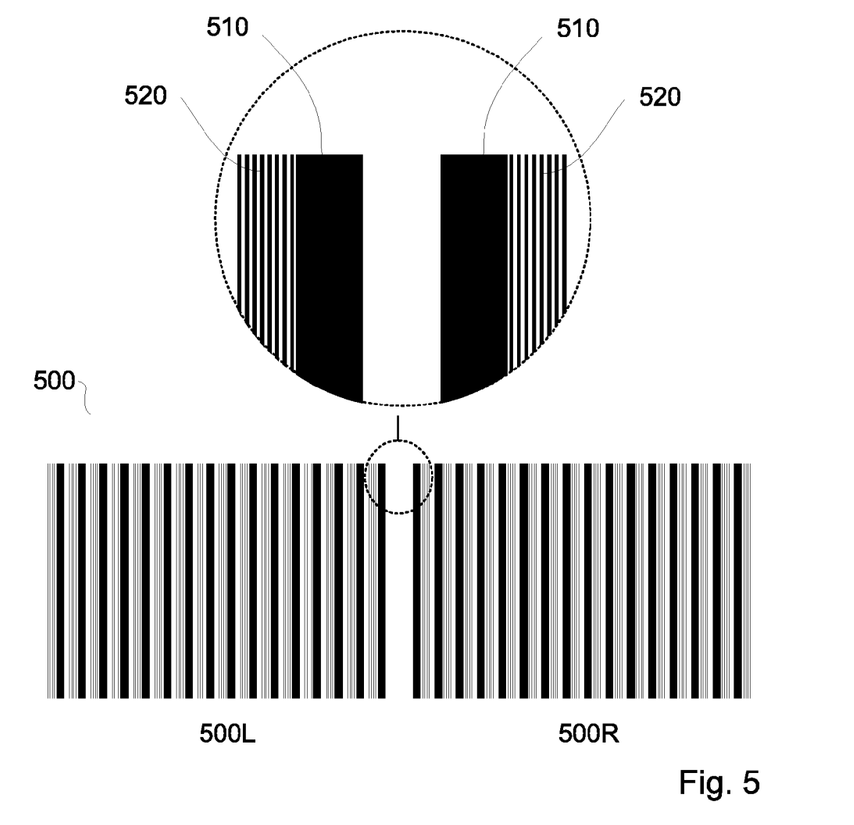
FIG. 5 shows a possible structure of a focus mark which comprises focus sensitive chopped bars.

FIG. 5 illustrates an example of a suitable focus mark (as seen on the reticle) which is presently used in methods such as described above. Marks on the reticle comprise alignment-type marks wherein a portion (e.g., half) of each of the line structures are "chopped" (subsegmented into sub-gratings or sub-periodic features) instead of being continuous. As such, the mark 500 comprises a periodic feature or grating with each individual line or grating feature comprising a solid portion 510 and chopped portion 520.

The imaging quality of the chops of chopped portion 520 depends on the contrast, according to those structures' Bossung curves. Consequently, the effective aligned position seen by an alignment sensor is anything between the center of the continuous line structure and that of the complete line structure. Thus the aligned offset, plotted as a function of defocus, behaves like a Bossung curve. The position of the peak on the resulting curve shows the optimum focus, while the height of that peak shows the degree of 'fading' caused by dynamic errors. As an algorithm, such a method may comprise:

1. expose a periodic focus mark at a given defocus;
2. read out this mark using an Alignment Sensor (AS);
3. fit the periodic AS raw signal with a sinusoid having the same period of the mark; the phase shift $\varphi_1$ of this sinusoid is dependent on the defocus value (f) during exposure ($\varphi_1(f)$);
4. Read out the phase shift from the measurement. This phase shift $\varphi_1$ may be referred to as an Alignment offset (AO(f)=$\varphi_1(f)$);
5. The focus curve AO(f) is well approximated by a parabola around the Best Focus value (BF), therefore BF is measured by fitting the top of the focus curve.

One disadvantage of the current method is that the phase shift $\varphi_1$ (i.e. the Alignment Offset AO) is also dependent on other asymmetry contributions such as overlay errors OV, and not only on focus induced asymmetry; i.e., $\varphi_1=\varphi_1(f, OV)=\theta(f)+OV$.

To remove the overlay contribution, a measurement at each measurement location may measure two marks which are mirror symmetric with respect to each other. This is shown in FIG. 5, where there is a right 500R and left 500L mark. The overlay error is the same for these two marks, while the focus dependence is inverted (due to the L/R symmetry). Mathematically:

the phase shift for the right mark 500R is $\varphi_{1,R}=\varphi_{1,R}(f, ovl)=\theta(f)+ovl$; and the phase shift for the left mark 500L is $\varphi_{1,L}=\varphi_{1,L}(f,ovl)=-\theta(f)+ovl$.

Therefore, by taking the difference between the right and left alignment offsets (phase shifts), the overlay error can be eliminated, and a signal which is dependent only on focus is obtained.

There are a number of drawbacks with this approach. The large size of total mark, comprising two separate marks (L and R), doubles the readout time and reticle/substrate area required. The total time spent on focus calibration and verification is largely impacted by this. Moreover, the current form of signal processing for the alignment mark measurement requires the two marks to cancel out the possible overlay, which assumes that the overlay of the two sub marks will be equal, which may not necessarily be so. The measurement signal comprises noise and other artifacts. Present methods currently decompose the signal into Fourier components and calculate the phase differences. The periodicity assumption of the signal is not robust to the aliasing problem (not taking a full period, or multiple integer of period, of the signal for the Fourier decomposition); this causes error in calculating the alignment offset and consequently defocus.

There is more information embedded in the raw alignment signal which can be used for tracing other parameters/variations between different marks and fields but currently not exploited. Methods disclosed below exploit this additional information.

A number of focus measurement methods are therefore proposed which enables focus to be measured from a single mark while still mitigating the impact of overlay error. The methods make use of the additional information available in the measured periodic raw signal from the Alignment Sensor (AS), compared to the information currently used.

In a first embodiment, rather than or in addition to the phase shift of the first harmonic $\varphi_1$ (and of higher order harmonics), the amplitudes of these harmonic components are used in determining focus. The inventor has determined that these amplitudes do not suffer from overlay errors, contrary to what happens to the phases of the harmonic components. This embodiment also discloses a new mark design which better exploits this method.

Figure 6:
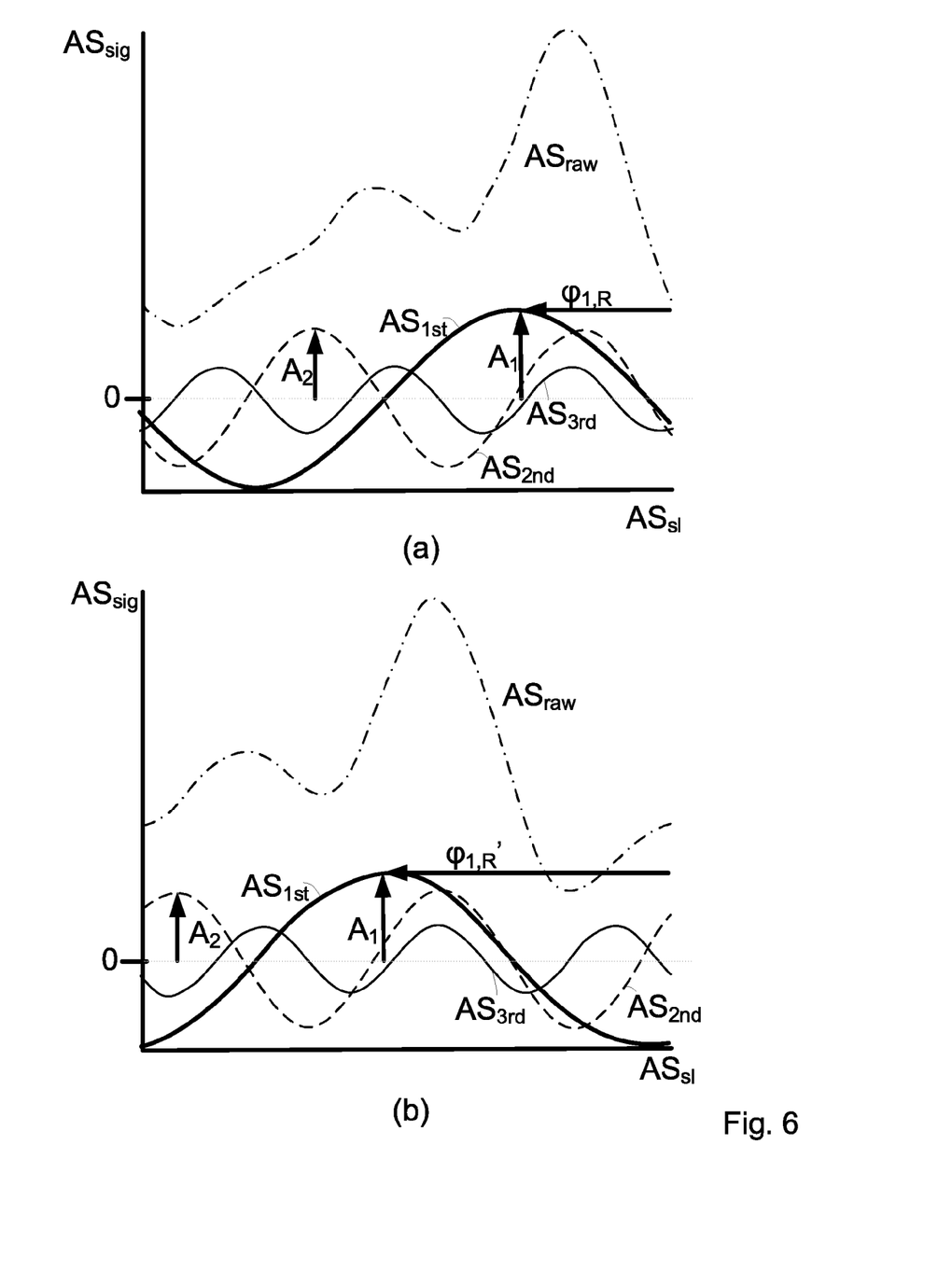
FIG. 6 comprises a plot of an alignment sensor raw signal and its first three harmonic components against scan length (a) for a mark with no overlay error present; and (b) for a mark with an overlay error present.

FIG. 6 illustrates this. Its shows plots of Alignment sensor signal $AS_{sig}$ against scan length $AS_{sl}$ (a) with no overlay error present and (b) with an overlay error present. In each plot, the raw signal $AS_{raw}$ and its first three harmonic components $AS_{1st}$, $AS_{2nd}$, $AS_{3rd}$ is shown. Only the phase $\varphi_{1,R}$ of the first harmonic is used in the current method, as alignment offset (in combination with the phase $\varphi_{1,L}$ from the left mark). When an overlay error is present (FIG. 6(b)), the phase $\varphi_{1,R}$ is impacted (shifted) by a significant amount such that $\varphi_{1,R}\neq\varphi_{1,R}$. However, the amplitudes of the harmonics (e.g. $A_1$ and $A_2$ of first and second harmonic respectively) do not suffer from overlay errors (i.e., they do not change as the raw signal is shifted backward or forward).

Therefore, it is proposed that by deriving focus from amplitudes instead of phase shifts, an overlay-insensitive focus value can be inferred from a single mark. In this way, roughly a 50% gain in readout time may be achieved for all the focus tests.

It may be appreciated that these amplitudes can suffer from amplitude drifts and variations of the AS raw signal.

For example, the amplitude of the AS raw signal may be affected by variations of the AS light source intensity, or variations of the gain of the electronics used to generate the raw signal. Since the readout in focus tests may last hours, it can be envisioned that the overall AS output may not be stable enough in order to use a single amplitude signal to reliably retrieve focus values.

However, referring back to FIG. 6, it can be seen that the focus-dependent signal given by the ratio $r(f)=A_2(f)/A_1(f)$ between the first harmonic amplitude $A_1(f)$ and the second harmonic amplitude $A_2(f)$ is an overlay-independent focus signal which is also not dependent on amplitude drifts of the alignment sensor raw signal. As such, if the amplitude of the raw signal changes by a factor C (e.g. due to drifts in the AS light source), then both the amplitudes $A_1$ and $A_2$ change by the same factor (becoming $CA_1$ and $CA_2$), and the ratio $r=CA_2/CA_1=A_2/A_1$ remains constant. Therefore, the proposed metric according to an embodiment is a suitable combination of the amplitudes of at least two harmonics of the alignment signal; e.g., a ratio r(f) between the amplitudes of two harmonic components of the AS raw signal. Any other combination which yields an overlay-independent focus signal which also removes dependency on amplitude of the raw signal can also be used.

Figure 7:
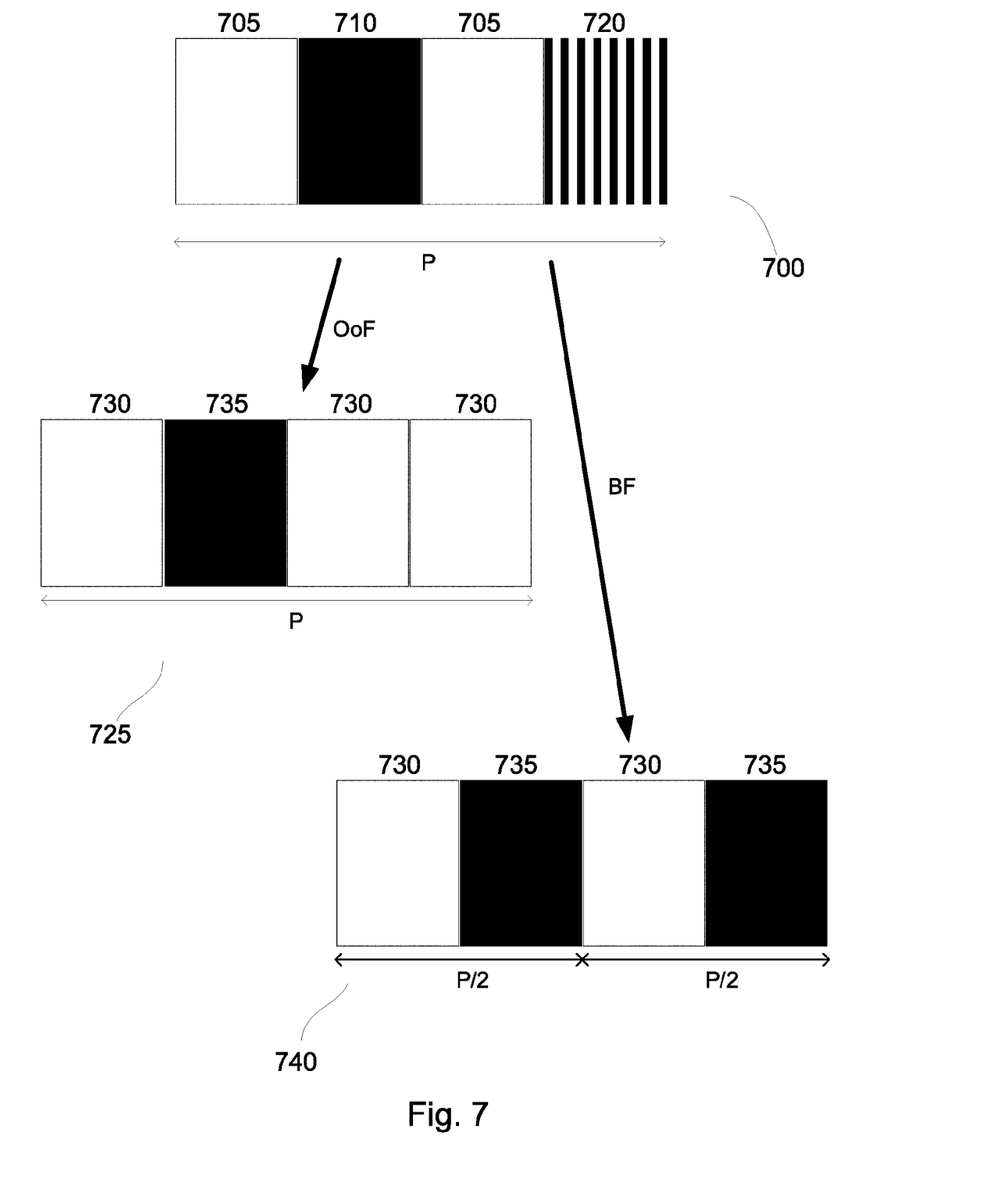
FIG. 7 illustrates a focus mark readable using an alignment sensor according to an embodiment of the invention.

FIG. 7 is a schematic illustration of a proposed mark for exploiting this alternative focus signal r(f) according to an embodiment. Such a mark maximizes the focus response of the amplitude ratio signal r(f). In other words, such a mark gives a good focus curve for the amplitude ratio signal r(f) (e.g. a curve with enough capture range and amplitude). The current focus marks are designed to give a good focus curve $\varphi_1(f)$, i.e., a good focus curve in terms of phase shift (or alignment offset), and do not necessarily yield a good focus curve in terms of amplitude ratio r(f).

The mark 700 on the reticle comprises a periodic structure where one in every two bars is focus sensitive. As such, the mark may comprise a repeating patterns of solid bar 710 and focus sensitive bar or chopped bar 720 separated by spaces 705; e.g., with a 50% duty cycle. The principle behind this design is to have a mark which changes its harmonic content (i.e. its amplitude spectrum) with focus. When the chopped bar 720 is exposed Out of Focus OoF at a dose greater than the dose to clear, then the effect in resist 725 is closer to that of a space (fully exposed resist), such that it may be read as a space. As such, the effect on the wafer is similar to a mark with period P and with a duty cycle of 25% (e.g., repetitions of three spaces 730 and a solid bar 735). On the other hand, when the chopped bar 720 is exposed at Best Focus BF, its effect in resist is more similar to that of a bar (and therefore will be read as such). Therefore, at best focus, the mark 740 on the wafer will behave closer to a mark with two bars 735 and two spaces 730 in the period P, i.e., closer to a mark with period P/2. This behavior will change the harmonic spectrum of the AS raw signal. Out of focus, the $1^{st}$ harmonic (periodicity P) will be higher than at best focus, while at best focus the $2^{nd}$ harmonic of the signal will increase (P/2 periodicity).

The specific arrangement may differ from the mark shown in FIG. 7, which is only an example. Any alignment mark type designed to increase the response of an amplitude ratio (or other combination) of at least two harmonics of the measured signal may be used. Such a mark on the reticle may comprise (but is not limited to) alternating reflective and absorbing segments (e.g., spaces and bar respectively), with one (or more) of the bars (and/or one of the spaces) comprising a focus sensitive sub-segmented bar (chopped bar). The chopped bar modulates the resist height after PEB in a focus-sensitive way, while the full bars and spaces modulate the resist height almost equally through focus. In this way the spectral content of the exposed mark is modulated by focus. For example, marks may have bars of P/3 length, designed to modulate the $3^{rd}$ order harmonic. Alternatively, marks may have two sets of features of different sizes, e.g., alternating length P/3 and length P/2 features to modulate $2^{nd}$ and $3^{rd}$ order harmonics. The alternating sizes may apply to both the focus-sensitive (chopped) bars and the solid bars. It should be appreciated that the best signal may not necessarily be the $2^{nd}/1^{st}$ harmonic amplitude ratio, but sometimes other ratios or combinations of harmonics amplitudes.

After the Post Exposure Bake (PEB), the chopped area is almost fully exposed. This means that during PEB the resist in this region will be almost completely deprotected, with a consequent reduction in the resist height. An opposite behavior is observed when the resist is exposed at best focus. Here part of the resist under the chopped area remains protected, and will undergo almost no shrinkage. The loss of thickness allows the post-PEB resist to be readout by the Alignment Sensor, since the height variation in resist acts as a diffraction grating (a so called "latent readout", since the resist does not have to be developed in order to give an alignment signal). Note that the AS signal comprises the harmonic components of the mark itself.

By way of a specific example, it can be shown for various defocus values and the example mark of FIG. 7, that the $2^{nd}$ order harmonic increases and $1^{st}$ order harmonic decreases when moving from out of focus to best focus. For this reason the ratio r(f) between the $2^{nd}$ and $1^{st}$ harmonic yields a focal curve with a maximum at best focus. This curve can be used to determine best focus in resist, by sampling it at several defocus positions, and then by finding the defocus value for which the curve reaches its maximum (e.g. by fitting the sampled data with a parabola).

A second embodiment will now be described for processing the raw alignment signal collected from only one mark per measurement location, while decoupling overlay from focus. This embodiment also shows good performance using marks of present design, obviating any mark design change (other than, optionally, dispensing with the second mirrored mark per measurement location).

This embodiment comprises an unsupervised learning approach. Such an approach may comprise applying a linear or nonlinear dimensionality reduction method to measurement data relating to different measurement locations and focus offsets, so as to decouple common sensor noise, overlay and other artifacts from the latent signal which has the desired relation with the focus offset. Suitable dimensionality reduction methods may include, for example, principal component analysis (PCA), Isomap, or uniform manifold approximation and projection (UMAP).

The method may comprise obtaining measurement data comprising raw alignment signals from different measurement locations, each corresponding to one of a plurality of similar single mark structures having been formed with varying focus offset at the different locations. This measurement data Data may then be stacked in the following matrix form:

$$\text{Data} = \begin{bmatrix} x_1^1, x_2^1, \ldots, x_n^1 \\ \vdots \\ x_1^m, x_2^m, \ldots, x_n^m \end{bmatrix}$$

where m denotes the total number of measurement locations on the wafer with different focus offsets and n is the total length of the discretized alignment signal. The rows of the Data matrix are alignment measurement of each mark location on the wafer, the columns of the discretized x values of each alignment signal.

The application of the dimensionality reduction method to this data matrix, decouples common sensor noise, overlay and other artifacts from the latent signal that has the desired relation with the focus offset. The data matrix may then be decomposed into two matrices, A and B:

$$\text{Data}^{(m \times n)} = A^{(m \times n')} B^{(n' \times n)} + \text{mean(Data)}, \text{ with } n' \leq n \quad (2)$$

The matrix A is the representative of Data matrix in a space with orthogonal bases, possibly with a lower dimension n' than n. The method then comprises examining this matrix A to identify which of its columns has an expected relationship, e.g., the desired parabolic relation to the focus offset. This column represents purified alignment or focus signal data, having been extracted from the noisy and possibly overlay contaminated raw alignment signal. It has been observed that mapping to only the first component was sufficient to achieve a very accurate representation of defocus without significant contribution from other factors. The focal curve can then be constructed by plotting the chosen column of A versus the set focus offsets. The maximum of the chosen column can be found from the curve, and best focus (BF) may be defined as its corresponding focus offset.

Figure 8:
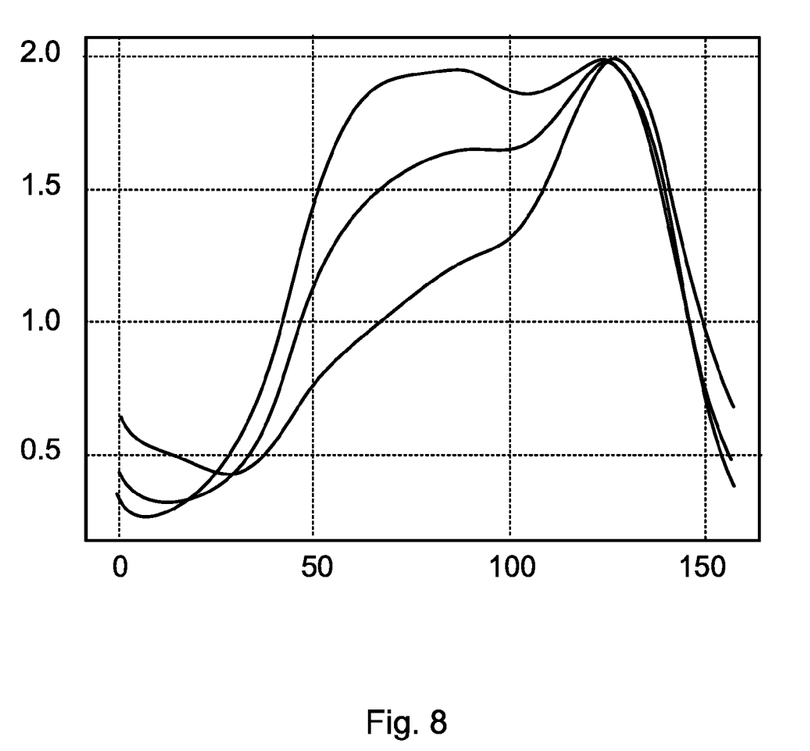
FIG. 8 is a plot of a raw alignment signal (amplitude against position) from a single focus mark, for three different defocus values.

FIG. 8 shows the raw alignment readout signal from a single structure mark, for different defocus levels. As can be observed, different defocus levels encode a different shape into the alignment signal. As has been described, a current method uses the phase shift to achieve an scalar alignment offset, which in turn is used to create the focal curve to estimate best focus (or the unknown focus in a focus uniformity verification test (FUV)). However, this way is very much affected by the actual unknown overlay of the mark. As discussed in the previous section, we use our unsupervised learning technique to map the shape of the alignment signal, while being insensitive to phase/x shift.

It has been shown that mapping of the raw alignment signal (into a 1-dimensional space), using linear PCA is sufficient to construct an accurate focus curve and infer best focus, even when the data is noisy and the marks have varying overlay offset. Nonlinear methods (e.g., Isomap and UMAP) can be shown to construct an even sharper curve and provide a more discriminative best focus determination.

In another embodiment, it is proposed to use independent component analysis (ICA) on multiple measurements with different focus offsets, based on the assumption that overlay and measurement noise are independent of focus. Using this assumption, the raw alignment signal can be decomposed into a (weighted) focus signal and other components. In order to find the focus component, a constraint can be added to the optimization of the ICA method, such that it looks for a signal with certain expected characteristics; e.g., a change in sign and a range corresponding to the imposed set focus values. This signal can then be processed as in the previous example to obtain a best focus value.

An embodiment which utilizes a supervised learning approach will now be described. Such a method may be based on a focus test on multiple fields with different induced focus offsets (such a test layout may be similar to the focus test layout described above in relation to FIG. 8 and a FUV layout). Once exposed and measured, the raw alignment signals $AL_i$ and the corresponding (known) set focus values $f_i$ may be used to train a suitable model to infer focus from the raw alignment data. Such a model may comprise, for example, a Kernel regression model or a simple neural network (e.g., having only one hidden layer). The input data may comprise per sample (e.g., per single structure mark at a measurement location): a row vector containing quantized/discrete values over the length (per x) of the alignment measurement, with corresponding reference label (set focus offset value per sample). In an embodiment, the total dataset may be divided into training, validation and testing sets, to avoid overfitting.

After training, the trained (e.g., nonlinear) model may be stored and used to infer focus from the raw alignment signal (from a single focus mark; e.g., on the verification fields in a FUV (focus uniformity verification) test.

In summary, the concepts disclosed herein describe a number of methods which use a readout of the alignment sensor, such that the measurement is overlay insensitive and eliminates the need of two mirror symmetric marks (Left and Right). This reduces the readout time of all the tests making use of a focus test method by a factor of two. This reduces the cycle time for the assembly of a system (by shortening the setup and qualification time), reduce the maintenance time whenever the machine needs such a test, e.g., recovery, recalibration or user-specific tests resulting in an increased availability and reduces the real estate of focal marks on the reticle.

Also disclosed is a patterning device comprising a plurality of periodic features for forming periodic structures on a substrate, each of said periodic features comprising alternating first segments and second segments, and wherein a proper subset of said first segments comprises focus sensitive first segments. Said focus sensitive segments comprise sub-segmented segments. The first segments may comprise absorbing segments and said second segments comprise reflective segments; or said first segments comprise reflective segments and said second segments comprise absorbing segments. The first segments may comprise alternating non-sensitive first segments having no significant focus sensitivity and said focus sensitive first segments. Said focus sensitive segments approximate a corresponding space on a substrate when exposed substantially out of focus and approximate a corresponding bar on a substrate when exposed at best focus.

While specific embodiments of the invention have been described above, it will be appreciated that the invention may be practiced otherwise than as described.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

Other aspects of the invention are set out in the following numbered clauses:

1. A method for determining a focus parameter value used to expose at least one structure on a substrate; comprising:

obtaining measurement data relating to a measurement of said at least one structure, wherein the at least one structure comprises a single periodic structure per measurement location;

decomposing said measurement data into component data comprising one or more components of said measurement data;

processing at least one of said components to extract processed component data having a reduced dependence on non-focus related effects; and determining said focus parameter value from said processed component data.

2. A clause as stated in clause 1, wherein:
said decomposing step comprises decomposing said measurement data to obtain at least two harmonic components of said measurement data; and
said processing step comprises determining a combination of amplitudes of each of said at least two harmonic components.

3. A clause as stated in clause 2, wherein said combination comprises a ratio of the amplitudes of each of said at least two harmonic components.

4. A clause as stated in clause 2 or 3, wherein said harmonic components comprise the first harmonic component and second harmonic component.

5. A clause as stated in any of clauses 2 to 4, wherein said at least one structure comprises at least one periodic structure which increases the response of the combination of amplitudes of said at least two harmonic components to said focus parameter.

6. A clause as stated in clause 5, comprising:
exposing said at least one periodic structure using a reticle comprising at least one corresponding periodic feature having alternating first segments and second segments, and
wherein a proper subset of said first segments comprises focus sensitive first segments.

7. A clause as stated in clause 6, wherein said focus sensitive segments comprise sub-segmented segments.

8. A clause as stated in clause 6 or 7, wherein said first segments comprise absorbing segments and said second segments comprise reflective segments; or said first segments comprise reflective segments and said second segments comprise absorbing segments.

9. A clause as stated in any of clauses 6 to 8, wherein said first segments comprise alternating non-sensitive first segments having no significant focus sensitivity and said focus sensitive first segments.

10. A clause as stated in any of clauses 6 to 9 wherein said focus sensitive segments approximate a corresponding space on a substrate when exposed substantially out of focus and approximate a corresponding bar on a substrate when exposed at best focus.

11. A clause as stated in any of clauses 6 to 10, comprising:
exposing a plurality of said structures at different focus parameter values;
measuring said structures to obtain said measurement data;
using the measurement data to determine a focus curve; and
using the focus curve to infer a best value for said focus parameter value in resist.

12. A clause as stated in clause 1, wherein:
said measurement data relates to different measurement locations and said structures formed with varying set values for the focus parameter;

said decomposing step and/or processing step comprises applying a linear or nonlinear dimensionality reduction method to decouple a latent signal having a desired relation with the focus parameter from said non-focus related effects.

13. A clause as stated in clause 12, wherein said dimensionality reduction method comprises at least one of: principal component analysis, Isomap, or uniform manifold approximation and projection.

14. A clause as stated in clause 12 or 13, wherein the method comprises:
stacking the measurement data into an m×n data matrix wherein m is the total number of measurement locations and n is the length of each discretized measurement signal from each measurement location;
decomposing the data matrix into at least two decomposition matrices, wherein a first decomposition matrix of said at least two decomposition matrices comprises a representation of the data matrix in a space with orthogonal bases; and
determining a column of the first decomposition matrix which displays an expected relationship with the focus parameter.

15. A clause as stated in clause 14, comprising constructing a focus curve by plotting the determined column of the first decomposition matrix versus the set focus parameter values; and determining a best focus parameter value from said focus curve.

16. A clause as stated in clause 12, wherein said dimensionality reduction method comprises an independent component analysis.

17. A clause as stated in clause 16, comprises performing said independent component analysis on said measurement data comprising multiple measurements with different focus parameter values, based on the assumption that said non-focus related effects are independent of the focus parameter.

18. A clause as stated in clause 16 or 17, wherein the decomposition step comprising decomposing the measurement data into a focus parameter component and other components.

19. A clause as stated in clause 17 wherein the decomposition step comprises, in order to find the focus parameter component, applying a constraint an independent component analysis optimization, such that the optimization seeks to identify a signal with expected characteristics indicative of the focus parameter.

20. A clause as stated in clause 19, wherein the expected characteristics comprise a change in sign and a range corresponding to the imposed set focus parameter values.

21. A method for determining a focus parameter value used to expose at least one structure on a substrate; comprising:
obtaining measurement data relating to a measurement of said at least one structure, wherein the at least one structure comprises a single periodic structure per measurement location;
obtaining a trained model, having been trained to infer focus from said measurement data; and
determining said focus parameter value from said trained model and said measurement data.

22. A clause as stated in clause 21, wherein the trained model comprises a Kernel regression model or a neural network.

23. A clause as stated in clause 21 or 22, comprising an initial step of training said trained model on training measurement data; said training measurement data comprising measurement data relating to a plurality of single periodic structures at different measurement locations and formed with varying set values for the focus parameter, said training measurement data being labeled with said set values.

24. A clause as stated in clause 23, wherein the training measurement data comprises per measurement location, a row vector containing discrete values over the length of a measurement signal corresponding to the measurement location, labeled with said corresponding set value.

25. A clause as stated in clause 23 or 24, wherein the training measurement data is divided into training, validation and testing sets, to avoid overfitting during said training.

26. A clause as stated in any preceding clause, wherein said measurement data comprises alignment data as measured using an alignment sensor.

27. A patterning device comprising a plurality of periodic features for forming periodic structures on a substrate, each of said periodic features comprising alternating first segments and second segments, and wherein a proper subset of said first segments comprises focus sensitive first segments.

28. A patterning device as stated in clause 27, wherein said first segments comprise alternating non-sensitive first segments having no significant focus sensitivity and said focus sensitive first segments.

29. A computer program comprising program instructions operable to perform the method of any of clauses 1 to 26, when run on a suitable apparatus.

30. A non-transient computer program carrier comprising the computer program of clause 29.

31. A processing device comprising:
a processor; and
program storage comprising a computer program comprising program instructions operable to perform the method of any of clauses 1 to 5 or 12 to 25.

32. A lithographic apparatus comprising:
an alignment sensor;
a patterning device support for supporting a patterning device;
a substrate support for supporting a substrate; and
the processing device of clause 31.

33. A lithographic apparatus as stated in clause 32; being further operable to perform the method of any of clauses 6 to 11.

34. A lithographic apparatus as stated in clause 32 or 33, being further operable to measure said at least one structure using said alignment sensor to obtain said measurement data.

35. A lithographic apparatus as stated in any of clauses 32 to 34, wherein said patterning device support comprises the patterning device of clause 27 or 28 supported thereon.

36. A substrate comprising a plurality of periodic structures, having been exposed thereon using the patterning device of clause 27 or 28.

The invention claimed is:

1. A method for determining a focus parameter value used to expose a structure on a substrate, the method comprising:
obtaining measurement data relating to a measurement of the structure, wherein the structure comprises a single periodic structure per measurement location;
decomposing the measurement data into component data comprising first and second harmonic components of the measurement data;
processing the first and second harmonic components by determining a combination of amplitudes or phases of each of the first and second harmonic components to extract processed component data having a reduced dependence on non-focus related effects; and
determining the focus parameter value from the processed component data.

2. The method of claim 1, wherein the combination of phases comprises a difference of the phases of each of the first and second harmonic components.

3. The method of claim 1, wherein the structure comprises a periodic structure which increases a response of the combination of phases of the first and second harmonic components to the focus parameter.

4. The method of claim 1, wherein the combination of amplitudes comprises a ratio of the amplitudes of each of the first and second harmonic components.

5. The method of claim 1, wherein the first and second harmonic components comprise a first-order harmonic component and a second-order harmonic component.

6. The method of claim 1, wherein the structure comprises a periodic structure which increases a response of the combination of amplitudes of the first and second harmonic components to the focus parameter.

7. The method of claim 6, further comprising:
exposing the periodic structure using a reticle comprising a corresponding periodic feature having alternating first segments and second segments, and
wherein a proper subset of the first segments comprises focus sensitive first segments.

8. The method of claim 7, further comprising:
exposing a plurality of the structures at different focus parameter values;
measuring the plurality of the structures to obtain the measurement data;
using the measurement data to determine a focus curve; and
using the focus curve to infer a best value for the focus parameter value in resist.

9. The method of claim 1, wherein:
the measurement data relates to different measurement locations and a plurality of the structures formed with varying set values for the focus parameter; and
the decomposing and/or processing comprises applying a linear or nonlinear dimensionality reduction method to decouple a latent signal having a desired relation with the focus parameter from the non-focus related effects.

10. The method of claim 9, wherein the dimensionality reduction method comprises principal component analysis, Isomap, or uniform manifold approximation and projection.

11. The method of claim 9, further comprising:
stacking the measurement data into an m×n data matrix, wherein m is a total number of measurement locations and n is a length of each discretized measurement signal from each measurement location;
decomposing the data matrix into first and second decomposition matrices, wherein the first decomposition matrix comprises a representation of the data matrix in a space with orthogonal bases; and
determining a column of the first decomposition matrix which displays an expected relationship with the focus parameter.

12. A computer program comprising:
program instructions operable to perform the method of claim 1 when run on a suitable apparatus.

13. A processing device comprising:
a processor; and
program storage comprising a computer program comprising program instructions operable for determining a focus parameter value used to expose a structure on a substrate and for performing operations comprising:

obtaining measurement data relating to a measurement of the structure, wherein the structure comprises a single periodic structure per measurement location;

decomposing the measurement data into component data comprising first and second harmonic components of the measurement data;

processing the first and second harmonic components by determining a combination of amplitudes or phases of each of the first and second harmonic components to extract processed component data having a reduced dependence on non-focus related effects; and determining the focus parameter value from the processed component data.

14. A lithographic apparatus comprising:

an alignment sensor;

a patterning device support configured for supporting a patterning device;

a substrate support configured for supporting a substrate; and a processing device comprising:

a processor; and program storage comprising a computer program comprising program instructions operable for determining a focus parameter value used to expose a structure on a substrate and for performing operations comprising:

obtaining measurement data relating to a measurement of the structure, wherein the structure comprises a single periodic structure per measurement location;

decomposing the measurement data into component data comprising first and second harmonic components of the measurement data;

processing the first and second harmonic components by determining a combination of amplitudes or phases of each of the first and second harmonic components to extract processed component data having a reduced dependence on non-focus related effects; and determining the focus parameter value from the processed component data.

* * * * *

UNITED STATES PATENT AND TRADEMARK OFFICE
CERTIFICATE OF CORRECTION

PATENT NO. : 12,379,670 B2  
APPLICATION NO. : 18/000148  
DATED : August 5, 2025  
INVENTOR(S) : Marelli et al.

Page 1 of 1

It is certified that error appears in the above-identified patent and that said Letters Patent is hereby corrected as shown below:

In the Specification

In Column 13, Line 67, delete "f;" and replace with --$f_i$--.

Signed and Sealed this  
Twenty-third Day of September, 2025

John A. Squires  
*Director of the United States Patent and Trademark Office*